United States Patent
Xu

(10) Patent No.: US 10,636,352 B2
(45) Date of Patent: Apr. 28, 2020

(54) DISPLAY PANEL OF ACTIVE MATRIX ORGANIC LIGHT EMITTING DIODE, AND DISPLAY DEVICE

(71) Applicant: WUHAN CHINA STAR OPTOELECTRONICS SEMICONDUCTOR DISPLAY TECHNOLOGY CO., LTD., Wuhan, Hubei (CN)

(72) Inventor: Bin Xu, Hubei (CN)

(73) Assignee: Wuhan China Star Optoelectronics Semiconductor Display Technology Co., Ltd., Wuhan, Hubei (CN)

( * ) Notice: Subject to any disclaimer, the term of this patent is extended or adjusted under 35 U.S.C. 154(b) by 107 days.

(21) Appl. No.: 15/579,864

(22) PCT Filed: Nov. 6, 2017

(86) PCT No.: PCT/CN2017/109524
§ 371 (c)(1),
(2) Date: Dec. 5, 2017

(87) PCT Pub. No.: WO2019/037268
PCT Pub. Date: Feb. 28, 2019

(65) Prior Publication Data
US 2019/0066577 A1    Feb. 28, 2019

(30) Foreign Application Priority Data
Aug. 25, 2017    (CN) .......................... 2017 1 0739715

(51) Int. Cl.
*H01L 27/32*    (2006.01)
*G09G 3/3225*    (2016.01)

(52) U.S. Cl.
CPC ....... *G09G 3/3225* (2013.01); *H01L 27/3244* (2013.01); *H01L 27/3262* (2013.01); *G09G 2300/0408* (2013.01); *G09G 2310/0232* (2013.01); *G09G 2340/14* (2013.01); *H01L 27/3255* (2013.01)

(58) Field of Classification Search
CPC ............. G09G 3/3225; G09G 2340/14; G09G 2310/0232; H01L 27/3262
USPC ......................................................... 257/40
See application file for complete search history.

(56) References Cited

U.S. PATENT DOCUMENTS

| | | | | |
|---|---|---|---|---|
| 2002/0047120 A1* | 4/2002 | Inukai | .................. | G09G 3/2022 257/59 |
| 2013/0279012 A1* | 10/2013 | Lee | ..................... | G02B 3/0037 359/622 |
| 2013/0293595 A1* | 11/2013 | Kim | ..................... | G09G 3/3611 345/690 |
| 2016/0179453 A1* | 6/2016 | Jepsen | .................. | G06F 3/1446 345/690 |

(Continued)

*Primary Examiner* — Dzung Tran
(74) *Attorney, Agent, or Firm* — Muncy, Geissler, Olds & Lowe, P.C.

(57) ABSTRACT

A display panel of an active matrix organic light emitting diode (AMOLED) includes a first region and a second region arranged on at least one side of the first region. A plurality of switch units are arranged in the first region. A driving circuit is arranged in the second region. A light-emitting device array is arranged and corresponds to the switch units, and is arranged in the first region and the second region. The light-emitting device array in the second region is configured to cover a driving circuit.

8 Claims, 6 Drawing Sheets

(56) References Cited

U.S. PATENT DOCUMENTS

2016/0350052 A1* 12/2016 Chang .................. G06F 3/1446
2017/0092178 A1*  3/2017 Lee .................... H01L 27/1225
2017/0092198 A1*  3/2017 Ryu .................... G09G 3/3275

* cited by examiner

DISPLAY PANEL OF ACTIVE MATRIX ORGANIC LIGHT EMITTING DIODE, AND DISPLAY DEVICE

BACKGROUND

Field

The present disclosure relates to a technical field of display devices, and more particularly to a display panel of an active matrix organic light emitting diode (AMOLED), and a display device having the AMOLED display panel.

Background

With the rapid development of flat panel display technology, comparing AMOLED display devices with conventional liquid crystal display (LCD) devices, the AMOLED display devices include many characteristics of being lighter and thinner, self-luminous, having lower power consumption, no backlight source, no visual angle limit, and a better response rate. Thus, the AMOLED display devices have become a mainstream of next-generation display technology, and are more and more widely used.

Currently, a gate driver on array (GOA) feature is used to drive circuits arranged in an AMOLED display panel, for replacing external connected integrated circuits (IC). The GOA feature can simplify manufacturing processes of the AMOLED display panel, and the product cost is reduced, such that integration of the AMOLED display panel is increased, and the AMOLED display panel tends to be thinner. However, in a small size of a display panel, a GOA circuit is arranged on one side of the AMOLED display panel and occupies a larger area. The area cannot be used to display images, and thus, decreases display areas of the images, such that a visual screen ratio of the AMOLED display panel is reduced, where the visual screen ratio is defined as a ratio between a size of the display panel and a visual region of the display panel.

Therefore, for the display panel in related art, a side area of the display panel occupied by the GOA circuit is increased, thereby decreasing the visual screen ratio of the display panel. A full display screen of the display panel cannot be achieved.

SUMMARY OF THE DISCLOSURE

Embodiments of the present disclosure provide a display panel of an active matrix organic light emitting diode (AMOLED), and a display device having the AMOLED display panel, such that images can be displayed on a region corresponding to a GOA circuit. Since a side area of a conventional display panel having the AMOLED occupied by the GOA circuit is increased, thereby decreasing the visual screen ratio of the display panel, and a full display screen of the conventional display panel cannot be achieved. In the present disclosure, these problems can be solved by the AMOLED display panel and a display device having the AMOLED display panel.

In a first embodiment of the present disclosure, a display panel having AMOLED includes a first region and a second region arranged on at least one side of the first region. The display panel further includes a substrate, a plurality of pixel units, and a driving circuit. Each of the pixel units includes a switch unit and a light-emitting device. The switch unit is arranged on the substrate in an array, and includes a thin film transistor. The light-emitting device is arranged and corresponds to the switch unit, and is connected with the thin film transistor correspondingly. The driving circuit is arranged on the substrate and corresponds to the second region, and is connected with the thin film transistor correspondingly. A switch unit array includes at least four switch units and is arranged in the first region, and a light-emitting device array includes at least four light-emitting devices and is arranged in the first region and the second region. At least one of the four light-emitting devices arranged in the second region is configured to cover the driving circuit. The substrate includes a first side and a second side adjacent to the first side. The driving circuit includes a gate driving unit arranged near the first side, and a data signal driving unit arranged near the second side. The light-emitting device array is configured to cover the gate driving unit in a first dimensional direction, and the light-emitting device array is configured to cover the data signal driving unit in a second dimensional direction.

In one embodiment of the display panel, the light-emitting device array includes a first light-emitting device array, a second light-emitting device array, and a third light-emitting device array, wherein the first light-emitting device array is arranged on a side of the third light-emitting device array in the first dimensional direction, and the second light-emitting device array is arranged on a side of the third light-emitting device array in the second dimensional direction. Along the first dimensional direction, a size of the light emitting device in the first light emitting device array is greater than a size of the light emitting device in the third light-emitting device array. Along the second dimensional direction, a size of the light emitting device in the second light emitting device array is greater than a size of the light emitting device in the third light-emitting device array.

In one embodiment of the display panel, a length of a first long side of the first region corresponding to the light emitting device array is greater than a length of a second long side of the second region corresponding to the switch unit array, a length of a first short side of the first region is greater than a length of a second short side of the second region. The first region is an area corresponding to a first projection using a rectangular shape, and the second region is an area corresponding to a second projection using the rectangular shape. The first projection is a region of the light-emitting device on a plane where the display panel is located, and the second projection is a region of the switch unit on the plane where the display panel is located.

In one embodiment of the display panel, each of light emitting devices of the light-emitting device array has a same size.

In one embodiment of the display panel, the light emitting devices of the first light-emitting device array in at least one dimensional direction have different sizes, and the light emitting devices of the second light-emitting device array in at least one dimensional direction have different sizes.

In a second embodiment of the present disclosure, a display panel having AMOLED includes a first region and a second region arranged on at least one side of the first region. The display panel further includes a substrate, a plurality of pixel units, and a driving circuit. Each of the pixel units includes a switch unit and a light-emitting device. The switch unit is arranged on the substrate in an array, and includes a thin film transistor. The light-emitting device is arranged and corresponds to the switch unit, and is connected with the thin film transistor correspondingly. The driving circuit is arranged on the substrate and corresponds to the second region, and is connected with the thin film transistor correspondingly. A switch unit array includes at least four switch units and is arranged in the first region, and a light-emitting device array includes at least four light-emitting devices and is arranged in the first region and the second region. At least one of the four light-emitting devices arranged in the second region is configured to cover the driving circuit.

In one embodiment of the display panel, the light-emitting device array includes a first light-emitting device array, a second light-emitting device array, and a third light-emitting device array, wherein the first light-emitting device array is arranged on a side of the third light-emitting device array in the first dimensional direction, and the second light-emitting device array is arranged on a side of the third light-emitting device array in the second dimensional direction. Along the first dimensional direction, a size of the light emitting device in the first light emitting device array is greater than a size of the light emitting device in the third light-emitting device array. Along the second dimensional direction, a size of the light emitting device in the second light emitting device array is greater than a size of the light emitting device in the third light-emitting device array.

In one embodiment of the display panel, a length of a first long side of the first region corresponding to the light emitting device array is greater than a length of a second long side of the second region corresponding to the switch unit array, a length of a first short side of the first region is greater than a length of a second short side of the second region. The first region is an area corresponding to a first projection using a rectangular shape, and the second region is an area corresponding to a second projection using the rectangular shape. The first projection is a region of the light-emitting device on a plane where the display panel is located, and the second projection is a region of the switch unit on the plane where the display panel is located.

In one embodiment of the display panel, each of light emitting devices of the light-emitting device array has a same size.

In one embodiment of the display panel, the light emitting devices of the first light-emitting device array in at least one dimensional direction have different sizes, and the light emitting devices of the second light-emitting device array in at least one dimensional direction have different sizes.

In a third embodiment of the present disclosure, a display device includes a cover plate and a display panel having the AMOLED. The display panel comprises a first region and a second region that is arranged on at least one side of the first region. The display panel further includes a substrate, a plurality of pixel units, and a driving circuit. Each of the pixel units includes a switch unit and a light-emitting device. The switch unit is arranged on the substrate in an array, and includes a thin film transistor. The light-emitting device is arranged and corresponds to the switch unit, and is connected with the thin film transistor correspondingly. The driving circuit is arranged on the substrate and corresponds to the second region, and is connected with the thin film transistor correspondingly. A switch unit array includes at least four switch units and is arranged in the first region, and a light-emitting device array includes at least four light-emitting devices and is arranged in the first region and the second region. At least one of the four light-emitting devices arranged in the second region is configured to cover the driving circuit.

In one embodiment of the display device, the light-emitting device array includes a first light-emitting device array, a second light-emitting device array, and a third light-emitting device array, wherein the first light-emitting device array is arranged on a side of the third light-emitting device array in the first dimensional direction, and the second light-emitting device array is arranged on a side of the third light-emitting device array in the second dimensional direction. Along the first dimensional direction, a size of the light emitting device in the first light emitting device array is greater than a size of the light emitting device in the third light-emitting device array. Along the second dimensional direction, a size of the light emitting device in the second light emitting device array is greater than a size of the light emitting device in the third light-emitting device array.

In one embodiment of the display device, a length of a first long side of the first region corresponding to the light emitting device array is greater than a length of a second long side of the second region corresponding to the switch unit array, a length of a first short side of the first region is greater than a length of a second short side of the second region. The first region is an area corresponding to a first projection using a rectangular shape, and the second region is an area corresponding to a second projection using the rectangular shape. The first projection is a region of the light-emitting device on a plane where the display panel is located, and the second projection is a region of the switch unit on the plane where the display panel is located.

In one embodiment of the display device, each light emitting devices of the light-emitting device array has a same size.

In one embodiment of the display device, the light emitting devices of the first light-emitting device array in at least one dimensional direction have different sizes, and the light emitting devices of the second light-emitting device array in at least one dimensional direction have different sizes.

BRIEF DESCRIPTION OF THE DRAWINGS

The following embodiments refer to the accompanying drawings for exemplifying specific implementable embodiments of the present disclosure in a suitable computing environment. It should be noted that the exemplary described embodiments are configured to describe and understand the present disclosure, but the present disclosure is not limited thereto.

DETAILED DESCRIPTION OF THE PREFERRED EMBODIMENTS

The following embodiments refer to the accompanying figures for exemplifying specific implementable embodiments of the present disclosure in a suitable computing environment. It should be noted that the exemplary described embodiments are configured to describe and understand the present disclosure, but the present disclosure is not limited thereto. Directional terms, such as an upper side, a lower side, a front side, a back side, a left side, a right side, an inner side, an outer side, and a lateral side, mentioned in the present disclosure are only for reference. Therefore, the directional terms are used for describing and understanding rather than limiting the present disclosure. In the figures, units having similar structures are used for the same reference numbers.

Figure 1:
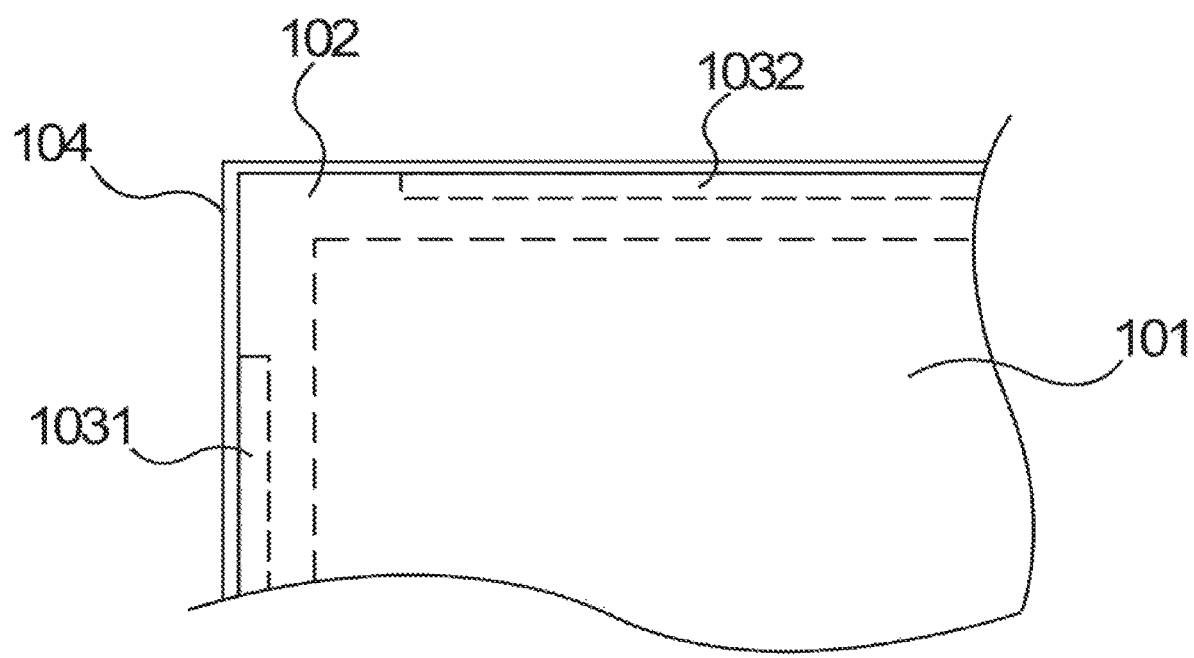
FIG. 1 is an illustrative structural diagram of an AMOLED display panel according to one embodiment of the present disclosure.

Since a side area of a conventional display panel having an AMOLED occupied by a GOA circuit is increased, thereby decreasing a visual screen ratio of the display panel, and a full display screen of the conventional display panel cannot be achieved. In of the present disclosure, these problems can be solved by the AMOLED display panel and a display device having the AMOLED display panel. The visual screen ratio is defined as a ratio between a size of the display panel and a visual region of the display panel As shown in FIG. 1, an AMOLED display panel of the present disclosure includes a first region 101 and a second region 102 arranged on at least one side of the first region 101.

The AMOLED display panel includes a substrate 104, a plurality of pixel units, and a driving circuit. Each of the pixel units includes a switch unit and a light-emitting device. The switch unit is arranged on the substrate 104 in an array, and includes a thin film transistor. The light-emitting device is arranged and corresponds to the switch unit, and is connected with the thin film transistor correspondingly.

The driving circuit is arranged on the substrate 104 and corresponds to the second region 102, and is connected with the thin film transistor correspondingly.

A switch unit array including switch units is arranged in the first region 101, and a light-emitting device array is arranged in the first region 101 and the second region 102. In the light-emitting device array, the light-emitting devices arranged in the second region 102 are configured to cover the driving circuit.

The substrate 104 includes a first side and a second side adjacent to the first side. The driving circuit includes a gate driving unit 1031 arranged near the first side, and a data signal driving unit 1032 arranged near the second side.

The light-emitting device array including light-emitting devices is configured to cover the gate driving unit 1031 in a first dimensional direction, the light-emitting device array is configured to cover the data signal driving unit 1032 in a second dimensional direction.

Thin film transistor includes a gate electrode, a source electrode, and a drain electrode. The gate electrode of the thin film transistor is connected with the gate driving unit 1031. The source electrode of the thin film transistor is connected with the data signal driving unit 1032. The drain electrode of the thin film transistor is connected with the light emitting device. For example, the light-emitting device includes a metal anode, an electron transmission layer, an emission layer, a hole transmission layer, and a metal cathode, that are arranged in a stacked manner. The metal anode is connected with the drain electrode of the thin film transistor, and the metal anode is arranged on a surface of the light-emitting device that is away from the substrate.

First Embodiment

Figure 2A:
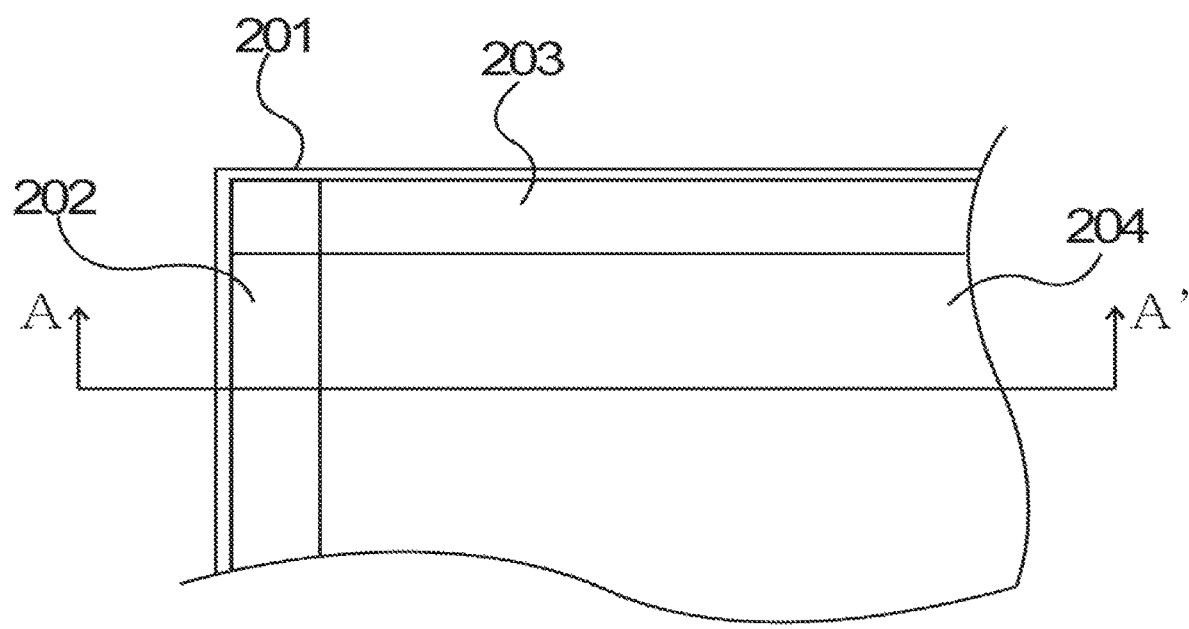
FIG. 2a is an illustrative structural diagram of the AMOLED display panel according to a first embodiment of the present disclosure.
Figure 2B:
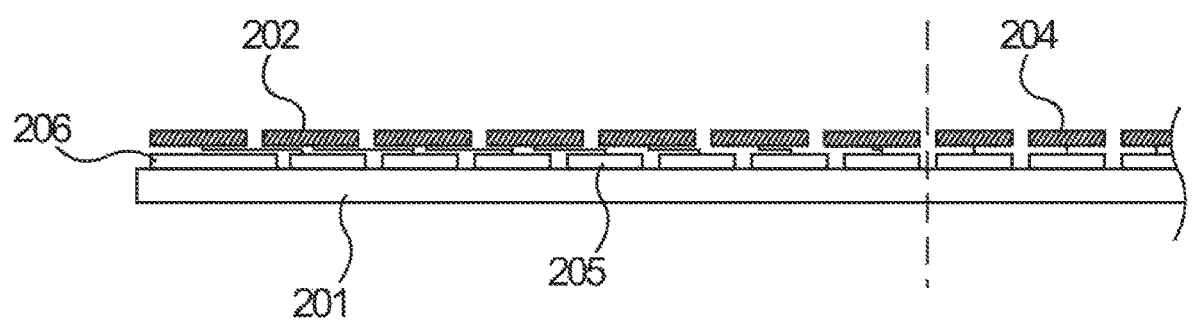
FIG. 2b is an illustrative cross-sectional diagram of the AMOLED display panel along a line A-A' in FIG. 2a according to the first embodiment of the present disclosure.

As shown in FIG. 2a and FIG. 2b, an AMOLED display panel of the present disclosure includes a substrate 201, a light-emitting device array arranged on the substrate 201, a switch unit 205, and a gate driving unit 206.

The light-emitting device array includes a first light-emitting device array 202, a second light-emitting device array 203, and a third light-emitting device array 204. The first light-emitting device array 202 is arranged on a side of the third light-emitting device array 204 in the first dimensional direction, and the second light-emitting device array 203 is arranged on a side of the third light-emitting device array 204 in the second dimensional direction.

The third light-emitting device array 204 is arranged in a first region of the AMOLED display panel. The first light-emitting device array 202 and the second light-emitting device array 203 are arranged in the second region of the AMOLED display panel.

For example, the gate driving unit 206 is arranged below the first light emitting device array 202, and the data signal driving unit is correspondingly arranged below the second light emitting device array 203.

In the first dimensional direction, a size of the light emitting device in the first light emitting device array 202 is greater than a size of the light emitting device in the third light-emitting device array 204.

In the second dimensional direction, a size of the light emitting device in the second light emitting device array 203 is greater than a size of the light emitting device in the third light-emitting device array 204.

For example, the size of the light emitting device in the first light emitting device array 202 is the same as that of the light emitting device in the second light-emitting device array 203.

In one embodiment of the present disclosure, only the size of the light emitting device near the driving circuit in a display layer is changed, and the size change of the whole display layer 202 is smaller. Thus, size calculation frequency of the light emitting device is reduced, an error rate is decreased, and the light emitting device is relatively simple in a manufacturing process. Only two size types of light emitting devices are arranged in the display layer 202, and the design of the mask plate used for preparing the light emitting device is relatively simplified. Only the size of regions corresponding to the first light emitting device array 202 and the second light emitting device array 203 needs to be changed.

Figure 2C:
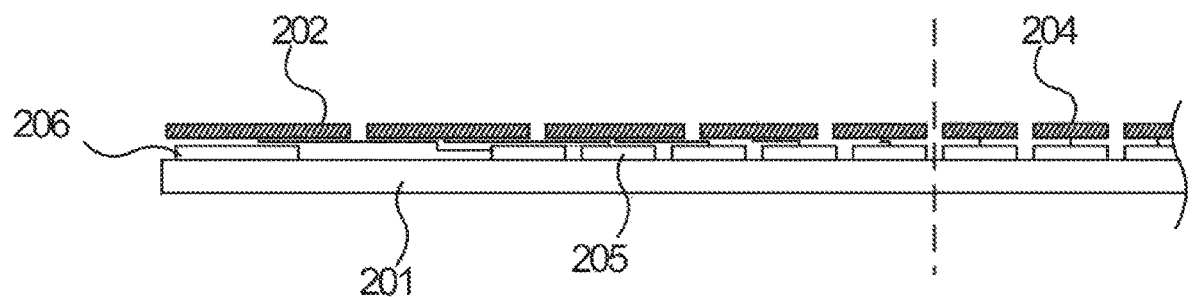
FIG. 2c is another illustrative cross-sectional diagram of the AMOLED display panel along the line A-A' in FIG. 2a according to the first embodiment of the present disclosure.

As shown in FIG. 2c, an AMOLED display panel of the present disclosure includes a substrate 201 and a light-emitting device array arranged on the substrate 201. In comparison with FIG. 2b, the light emitting devices of the first light-emitting device array 202 in at least one dimensional direction have different sizes. The light emitting devices of the second light-emitting device array 203 in at least one dimensional direction have different sizes.

For example, in the first light-emitting device array 202, from a side, that is away from the gate driving unit 206, to another side near the gate driving unit 206, a length of the light emitting devices in the first light-emitting device array 202 are increased, along the first dimensional direction. In the second light-emitting device array 203, from a side, that is away from the data signal driving unit, to another side near the data signal driving unit, a length of the light emitting devices in the second light-emitting device array 203 are increased, along the second dimensional direction.

In the first light-emitting device array 202, from a side, that is away from the gate driving unit 206, to another side near the gate driving unit 206, an interval number n of the light emitting devices in the first light-emitting device array 202 are spaced apart along the first dimensional direction. In the second light-emitting device array 203, from a side, that is away from the data signal driving unit, to another side near the data signal driving unit, an interval number m of the light emitting devices in the second light-emitting device array 203 are spaced apart along the second dimensional direction.

In the first light-emitting device array 202 along the first dimensional direction, an incremental difference y of continuous light emitting devices is defined as an expression that a width λ of the gate driving unit 206 is divided by the interval number n of the light emitting devices. In other words, along an incremental length direction of the first light-emitting device array 202, the incremental difference y is defined as a difference between one light emitting device and an adjacent light emitting device.

Similarly, in the second light-emitting device array 203 along the second dimensional direction, an incremental difference y' of continuous light emitting devices is defined as an expression that a width x' of the data signal driving unit is divided by the interval number m of the light emitting devices. In other words, along an incremental length direction of the second light-emitting device array 203, the incremental difference y' is defined as a length difference between a length of one light emitting device and a length of an adjacent light emitting device.

For example, an area of the first light-emitting device array 202 has one third of an area of the third light-emitting device array 204. An area of the second light-emitting device array 203 has one third of an area of the third light-emitting device array 204. Thus, a coverage area of the first light-emitting device array 202 is greater than that of the gate driving unit 206, and a coverage area of the second light-emitting device array 203 is greater than that of the data signal driving unit. In one embodiment, a length of the first light-emitting device array 202 in the first dimensional direction is increased, and a length of the second light-emitting device array 203 in the second dimensional direction is increased. Namely, the interval number n or the interval number m of the light-emitting devices is increased, such that the incremental difference y or y' of the continuous light-emitting devices are further reduced. In the first or the second dimensional direction, a size difference of the adjacent light-emitting devices is smaller, and the size difference is changed smoothly, such that the size difference between the display image of the corresponding region and the display image of the third light-emitting device array 204 is reduced.

In the first light-emitting device array 202 and the second light-emitting device array 203 of the first embodiment, size changes of the light emitting devices are in a gradually changed transition, such that a dislocation between the first light-emitting device array 202 or the second light-emitting device array 203 connected with other areas can be prevented, thereby improving display quality of images.

Second Embodiment

Figure 3:
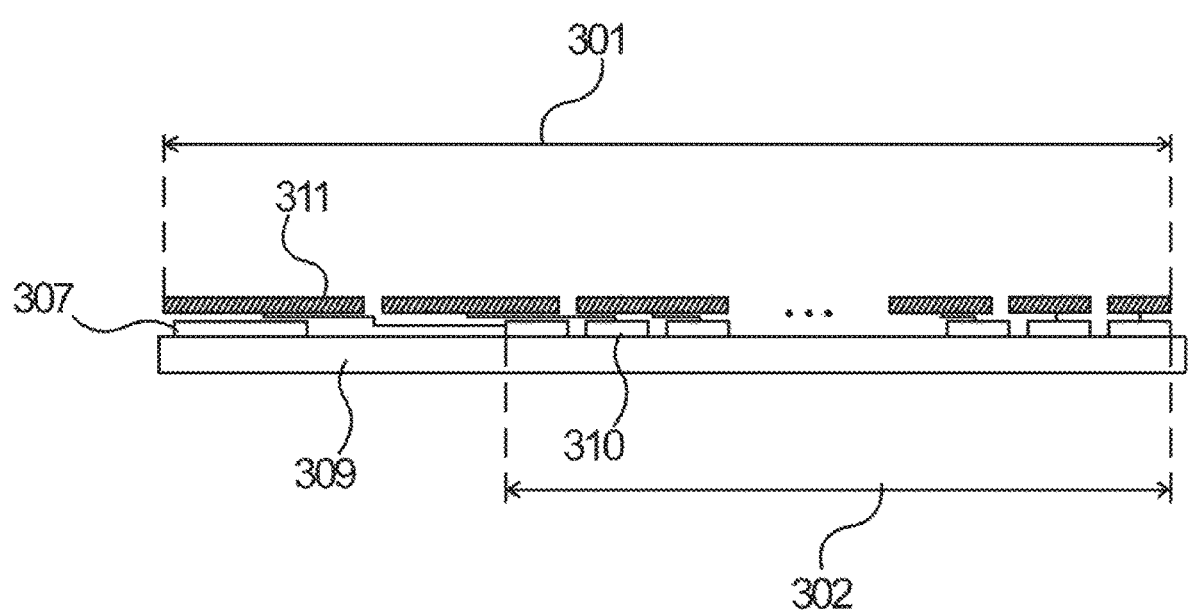
FIG. 3 is an illustrative structural diagram of an AMOLED display panel according to a second embodiment of the present disclosure.

As shown in FIG. 3, an AMOLED display panel of the present disclosure includes a first region 301 and a second region 302, where the second region 302 is arranged on at least one side of the first region 301.

A switch unit array 310 is arranged in the second region 302, and a light-emitting device array 311 is arranged in the first region 301 and the second region 302. In the light-emitting device array 311, the light-emitting devices arranged between the first region 310 and the second region 302 are configured to cover the driving circuits.

The light-emitting device array 311 is arranged on the substrate 309. The light-emitting device array 311 covers the gate driving unit 307 in a first dimensional direction, the light-emitting device array 311 covers the data signal driving unit in a second dimensional direction.

A length of a first long side of the first region 301 corresponding to the light emitting device array 311 is greater than a length of a second long side of the second region 302 corresponding to the switch unit array 310. A length of a first short side of the first region 301 is greater than a length of a second short side of the second region 302. The first region 301 is an area corresponding to a first projection using a rectangular shape, and the second region 302 is an area corresponding to a second projection using a rectangular shape. The first projection is a projection of the light-emitting device on a plane where the AMOLED display panel is located, and the second projection is a projection of the switch unit array on the plane where the AMOLED display panel is located.

For example, in the light-emitting device array 311, from a side, that is away from the gate driving unit 307, to another side near the gate driving unit 307, a length of the light emitting devices in the light-emitting device array 311 are increased, along the first dimensional direction. In the light-emitting device array 311, from a side, that is away from the data signal driving unit, to another side near the data signal driving unit, a length of the light emitting devices in the light-emitting device array 311 are increased, along the second dimensional direction.

In the light-emitting device array 311, from a side, that is away from the gate driving unit 307, to another side near the gate driving unit 307, an interval number n of the light emitting devices in the first light-emitting device array 202 are spaced apart along the first dimensional direction. In the light-emitting device array 311, from a side, that is away from the data signal driving unit, to another side near the data signal driving unit, an interval number m of the light emitting devices in the light-emitting device array 311 are spaced apart along the second dimensional direction.

In the light-emitting device array 311 along the first dimensional direction, an incremental difference y of continuous light emitting devices is defined as an expression of a width x of the gate driving unit 307 that is divided by the interval number n of the light emitting devices. In other words, along an incremental length direction of the light-emitting device array 311, the incremental difference y is defined as a difference between one light emitting device and an adjacent light emitting device.

Similarly, in the light-emitting device array 311 along the second dimensional direction, an incremental difference y' of continuous light emitting devices is defined as an expression of a width x' of the data signal driving unit that is divided by the interval number m of the light emitting devices. In other words, along an incremental length direction of the light-emitting device array 311, the incremental difference y' is defined as a length difference between a length of one light emitting device and a length of an adjacent light emitting device.

In the second embodiment, the light emitting devices of an AMOLED display panel have size changes of the light emitting devices in a gradually changed transition, such that in a whole display layer, a difference between lengths or widths of the light-emitting devices at any two coordinates is smaller, and thus, a display screen of the AMOLED display panel is more smooth.

Third Embodiment

Figure 4:
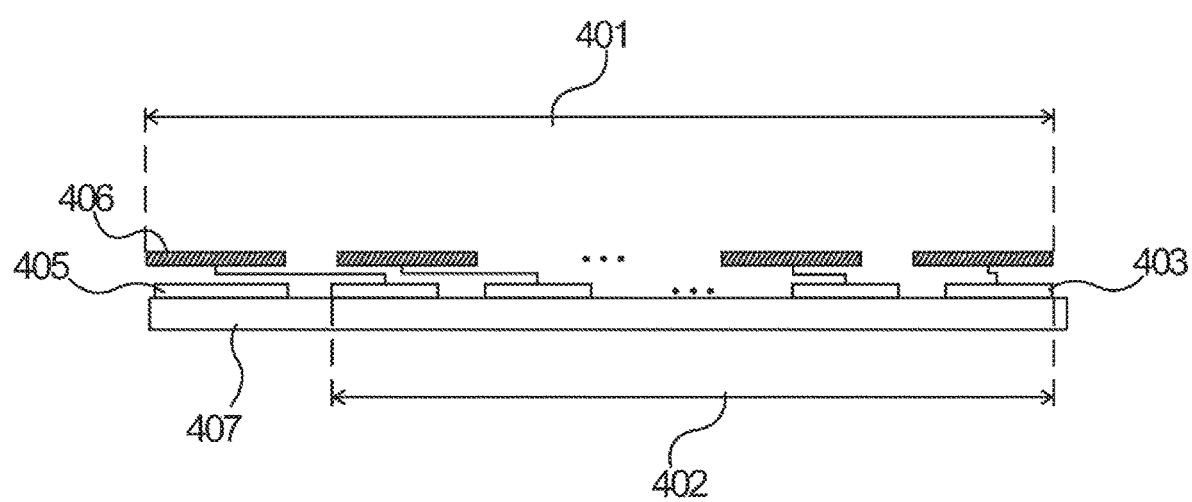
FIG. 4 is an illustrative structural diagram of an AMOLED display panel according to a third embodiment of the present disclosure.

As shown in FIG. 4, an AMOLED display panel of the present disclosure includes a first region 401 and a second region 402, where the second region 402 is arranged on at least one side of the first region 401.

A switch unit array 403 is arranged in the second region 402, and a light-emitting device array 406 is arranged in the first region 401 and the second region 402. In the light-emitting device array 406, the light-emitting devices arranged between the first region 401 and the second region 402 are configured to cover the driving circuits.

The light-emitting device array 406 is arranged on the substrate 407. The light-emitting device array 406 covers the gate driving unit 405 in a first dimensional direction, the light-emitting device array 406 covers the data signal driving unit in a second dimensional direction.

A length of a first long side of the first region 401 corresponding to the light emitting device array is greater than a length of a second long side of the second region 402 corresponding to the switch unit array 403. A length of a first short side of the first region 401 is greater than a length of a second short side of the second region 402.

In the second region 402, each of the switch unit arrays 403 has the same size. In the first region 401, each of the light emitting devices has a same size. The size of the light-emitting device is greater than that of the switch unit array 403.

For example, in the light-emitting device array 406 along the first dimensional direction, a first width difference y between the light emitting device and the switch unit is defined as an expression of a width x of the gate driving unit 405 that is divided by the interval number n of the light emitting devices. In other words, the first width difference x/n is defined as a difference between a light emitting device and a switch unit.

Similarly, in the light-emitting device array 406 along the second dimensional direction, a second width difference y' between the light emitting device and the switch unit is defined as an expression of a width x' of the gate driving unit 405 that is divided by the interval number m of the light emitting devices. In other words, the second width difference x'/n is defined as a difference between a light emitting device and a switch unit.

According to an objective of the present disclosure, an AMOLED display device includes a cover plate and an AMOLED display panel. The AMOLED display panel includes a first region and a second region, where the second region is arranged on at least one side of the first region. The AMOLED display panel further includes a substrate, a plurality of pixel units, and a driving circuit. The pixel units include a plurality of switch units and light-emitting devices, where the switch units are arranged on the substrate in an array. The switch units include a plurality of thin film transistors. The light-emitting devices are arranged opposite the switch units and connected with the thin film transistors correspondingly. The driving circuit is arranged on the substrate and corresponds to the second region, and connected with the thin film transistors correspondingly. A switch unit array includes least four switch units and is arranged in the first region. A light-emitting device array includes at least four light-emitting devices and is arranged in the first region and the second region. At least one light-emitting device arranged in the second region is configured to cover the driving circuit.

An operational principle of the AMOLED display device is similar to that of the AMOLED display panel of the above-mentioned embodiments. Specific operations can be referred to the above embodiments, and descriptions are not repeated herein.

Comparing with an AMOLED display panel in related art, an organic light emitting diode (OLED) (e.g., AMOLED) display device having the AMOLED display panel of the present disclosure is extended to a GOA circuit, such that the GOA circuit is hidden. Furthermore, a display area of the AMOLED display panel is effectively increased, such that a visual screen ratio of the AMOLED display panel is improved. Since a side area of a conventional display panel having the AMOLED occupied by the GOA circuit is increased, thereby decreasing the visual screen ratio of the display panel, and a full display screen of the conventional display panel cannot be achieved. In the present disclosure, these problems can be solved by the AMOLED display panel and a display device having the AMOLED display panel.

As is understood by a person skilled in the art, the foregoing preferred embodiments of the present disclosure are illustrative rather than limiting of the present disclosure. It is intended that they cover various modifications and similar arrangements be included within the spirit and scope of the present disclosure, the scope of which should be accorded the broadest interpretation so as to encompass all such modifications and similar structures.

What is claimed is:

1. A display panel of an active matrix organic light emitting diode (AMOLED), wherein the display panel comprises a first region and a second region arranged on at least one side of the first region, the display panel further comprising:
    a substrate;
    each of a plurality of pixel units comprising:
    a switch unit arranged on the substrate in an array, and comprising a thin film transistor; and
    a light-emitting device arranged and corresponding to the switch unit, and connected with the thin film transistor correspondingly; and
    a driving circuit arranged on the substrate and corresponding to the second region, and connected with the thin film transistor correspondingly;
    wherein a switch unit array comprises at least four switch units and is arranged in the first region, and a light-emitting device array comprises at least four light-emitting devices and is arranged in the first region and the second region;
    wherein at least one of the four light-emitting devices arranged in the second region covers the driving circuit;
    wherein the substrate comprises a first side and a second side adjacent to the first side;
    wherein the driving circuit comprises a gate driving unit arranged near the first side, and a data signal driving unit arranged near the second side;
    wherein the light-emitting device array covers the gate driving unit in a first dimensional direction, and the light-emitting device array covers the data signal driving unit in a second dimensional direction;
    wherein the light-emitting device array comprises a first light-emitting device array, a second light-emitting device array, and a third light-emitting device array, wherein the first light-emitting device array is arranged on a side of the third light-emitting device array in the first dimensional direction, and the second light-emitting device array is arranged on a side of the third light-emitting device array in the second dimensional direction;
    wherein along the first dimensional direction, a size of the light emitting device in the first light emitting device array is greater than a size of the light emitting device in the third light-emitting device array, wherein along the second dimensional direction, a size of the light emitting device in the second light emitting device array is greater than a size of the light emitting device in the third light-emitting device array.

2. The display panel according to claim 1, wherein a length of a first long side of the first region corresponding to the light emitting device array is greater than a length of a second long side of the second region corresponding to the switch unit array, a length of a first short side of the first region is greater than a length of a second short side of the second region;

wherein the first region is an area corresponding to a first projection using a rectangular shape, and the second region is an area corresponding to a second projection using the rectangular shape;

wherein the first projection is a region of the light-emitting device on a plane where the display panel is located, and the second projection is a region of the switch unit on the plane where the display panel is located.

3. The display panel according to claim 2, wherein each of light emitting devices of the light-emitting device array has a same size.

4. The display panel according to claim 2, wherein the light emitting devices of the first light-emitting device array in at least one dimensional direction have different sizes, and the light emitting devices of the second light-emitting device array in at least one dimensional direction have different sizes.

5. A display device of an active matrix organic light emitting diode (AMOLED), wherein the display device comprises a display panel having the AMOLED, wherein the display panel comprises a first region and a second region that is arranged on at least one side of the first region, the display panel further comprising:

a substrate;

each of a plurality of pixel units comprising:

a switch unit arranged on the substrate in an array, and comprising a thin film transistor; and a light-emitting device arranged and corresponding to the switch unit, and connected with the thin film transistor correspondingly; and a driving circuit arranged on the substrate and corresponding to the second region, and connected with the thin film transistor correspondingly;

wherein a switch unit array comprises at least four switch units and is arranged in the first region, and a light-emitting device array comprises at least four light-emitting devices and is arranged in the first region and the second region;

wherein at least one of the four light-emitting devices arranged in the second region covers the driving circuit;

wherein the light-emitting device array comprises a first light-emitting device array, a second light-emitting device array, and a third light-emitting device array, wherein the first light-emitting device array is arranged on a side of the third light-emitting device array in the first dimensional direction, and the second light-emitting device array is arranged on a side of the third light-emitting device array in the second dimensional direction;

wherein along the first dimensional direction, a size of the light emitting device in the first light emitting device array is greater than a size of the light emitting device in the third light-emitting device array;

wherein along the second dimensional direction, a size of the light emitting device in the second light emitting device array is greater than a size of the light emitting device in the third light-emitting device array.

6. The display device according to claim 5, wherein a length of a first long side of the first region corresponding to the light emitting device array is greater than a length of a second long side of the second region corresponding to the switch unit array, a length of a first short side of the first region is greater than a length of a second short side of the second region;

wherein the first region is an area corresponding to a first projection using a rectangular shape, and the second region is an area corresponding to a second projection using a rectangular shape;

wherein the first projection is a projection of the light-emitting device on a plane where the display panel is located, and the second projection is a projection of the switch unit array on the plane where the display panel is located.

7. The display device according to claim 5, wherein each of the light emitting devices of the light-emitting device array has a same size.

8. The display device according to claim 7, wherein the light emitting devices of the first light-emitting device array in at least one dimensional direction have different sizes, and the light emitting devices of the second light-emitting device array in at least one dimensional direction have different sizes.

* * * * *